United States Patent
Huang (10) Patent No.: US 7,692,462 B2
(45) Date of Patent: Apr. 6, 2010

(54) DELAY-LOCKED LOOP AND A STABILIZING METHOD THEREOF

(75) Inventor: Chih-Haur Huang, Fonghua Village (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 12/010,530

(22) Filed: Jan. 25, 2008

(65) Prior Publication Data

US 2009/0189656 A1 Jul. 30, 2009

(51) Int. Cl.
H03L 7/06 (2006.01)

(52) U.S. Cl. ........................... 327/158; 327/149

(58) Field of Classification Search ................ 327/149, 327/158

See application file for complete search history.

(56) References Cited

U.S. PATENT DOCUMENTS

| | | | | |
|---|---|---|---|---|
| 4,003,052 A * | 1/1977 | Adelman et al. | ............. | 342/162 |
| 4,047,097 A * | 9/1977 | Gyugyi et al. | ............... | 323/211 |
| 4,532,495 A * | 7/1985 | Gagnon | ............... | 341/110 |
| 5,222,084 A * | 6/1993 | Takahashi | ............... | 370/290 |
| 5,375,148 A * | 12/1994 | Parker et al. | ............... | 375/376 |
| 5,568,146 A * | 10/1996 | Park | ............... | 341/145 |
| 5,661,673 A * | 8/1997 | Davis | ............... | 708/628 |
| 5,966,314 A * | 10/1999 | Lee | ............... | 708/319 |
| 6,067,363 A * | 5/2000 | Dent | ............... | 381/113 |
| 6,112,218 A * | 8/2000 | Gandhi et al. | ............... | 708/320 |
| 6,249,152 B1 * | 6/2001 | Tanaka et al. | ............... | 327/34 |
| 6,486,818 B1 * | 11/2002 | Nicholson et al. | ............... | 341/154 |
| 6,512,798 B1 * | 1/2003 | Akiyama et al. | ............... | 375/261 |
| 6,545,545 B1 * | 4/2003 | Fernandez-Texon | ........ | 331/1 R |
| 6,678,709 B1 * | 1/2004 | Gandhi et al. | ............... | 708/319 |
| 6,815,989 B2 * | 11/2004 | Seo | ............... | 327/158 |
| 6,999,016 B2 * | 2/2006 | Haga et al. | ............... | 341/144 |
| 7,019,550 B2 * | 3/2006 | Wehage et al. | ............... | 326/16 |
| 7,024,324 B2 * | 4/2006 | Rifani et al. | ............... | 702/79 |
| 7,206,798 B1 * | 4/2007 | Davis | ............... | 708/300 |
| 7,308,372 B2 * | 12/2007 | Rifani et al. | ............... | 702/69 |
| 7,327,176 B2 * | 2/2008 | Takai et al. | ............... | 327/158 |
| 7,348,823 B2 * | 3/2008 | Takai et al. | ............... | 327/291 |
| 7,400,181 B2 * | 7/2008 | Metz et al. | ............... | 327/149 |
| 7,425,858 B1 * | 9/2008 | Daga | ............... | 327/279 |
| 7,439,886 B2 * | 10/2008 | Zhan et al. | ............... | 341/67 |
| 7,453,922 B2 * | 11/2008 | Oates et al. | ............... | 375/148 |
| 7,486,125 B2 * | 2/2009 | Chae | ............... | 327/285 |
| 7,495,518 B1 * | 2/2009 | Lee et al. | ............... | 331/16 |
| 2003/0043950 A1 * | 3/2003 | Hansen et al. | ............... | 375/376 |
| 2005/0218956 A1 * | 10/2005 | LaBerge | ............... | 327/291 |
| 2006/0114039 A1 * | 6/2006 | Freyman et al. | ............. | 327/161 |

(Continued)

*Primary Examiner*—Lincoln Donovan
*Assistant Examiner*—Adam D Houston
(74) *Attorney, Agent, or Firm*—Rabin & Berdo, P.C.

(57) ABSTRACT

A delay-locked loop includes a phase detector, a shift register, a digital low pass filter, a digital to analog converter, a bias circuit, and a delay circuit. The phase detector generates a lagging signal and a leading signal corresponding to a phase difference between an input clock signal and a feedback clock signal. The shift register outputs a digital data according to the lagging signal and the leading signal. The digital low pass filter generates a selecting signal according to the digital data. The bias circuit generates a first control voltage and a second control voltage in response to the bias voltage converted from the selecting signal. The delay circuit generates the feedback clock signal corresponding to the first control voltage and the second control voltage.

16 Claims, 6 Drawing Sheets

U.S. PATENT DOCUMENTS

| | | | |
|---|---|---|---|
| 2006/0122806 A1* | 6/2006 | Rifani et al. | 702/177 |
| 2006/0193419 A1* | 8/2006 | Maneatis et al. | 375/376 |
| 2006/0285614 A1* | 12/2006 | Van Stralen et al. | 375/350 |
| 2007/0075759 A1* | 4/2007 | Metz et al. | 327/158 |
| 2007/0132497 A1* | 6/2007 | Chae | 327/285 |
| 2007/0182602 A1* | 8/2007 | Zhan et al. | 341/67 |
| 2008/0042716 A1* | 2/2008 | Lee | 327/287 |
| 2008/0136485 A1* | 6/2008 | Takai et al. | 327/263 |
| 2009/0070654 A1* | 3/2009 | Flachs et al. | 714/758 |
| 2009/0140783 A1* | 6/2009 | Ishikawa | 327/158 |
| 2009/0146704 A1* | 6/2009 | Huang | 327/158 |
| 2009/0146705 A1* | 6/2009 | Huang | 327/158 |

* cited by examiner

DELAY-LOCKED LOOP AND A STABILIZING METHOD THEREOF

BACKGROUND

1. Field of Invention

The present invention relates to a phase detector. More particularly, the present invention relates to a delay-locked loop circuit.

2. Description of Related Art

Recently, with the outstanding improvement of the semiconductor process, the operating frequency of the VLSI circuits has increased a lot. The high-speed systems, such as wireless phones, optical fiber links, microcomputers, and high-end system-on-a-chip (SOCs), reach the GHZ level. Therefore, the electronic devices need to upgrade their operating frequency in order to keep up with the improved semiconductor process. Furthermore, since a lot of circuits are integrated on a chip, the clock signal is entirely distributed on the chip, and the clock skew problem arises as a result.

For example, when an input clock drives a chip, an uncertain delay appears between the input clock and the internal clock, which makes the chip work incorrectly. In order to synchronize the system clock and suppress the clock skew of the chip, the phase-locked loop (PLLs) and delay-locked loop (DLLs) have been applied in many high-speed circuits and systems.

Figure 1:
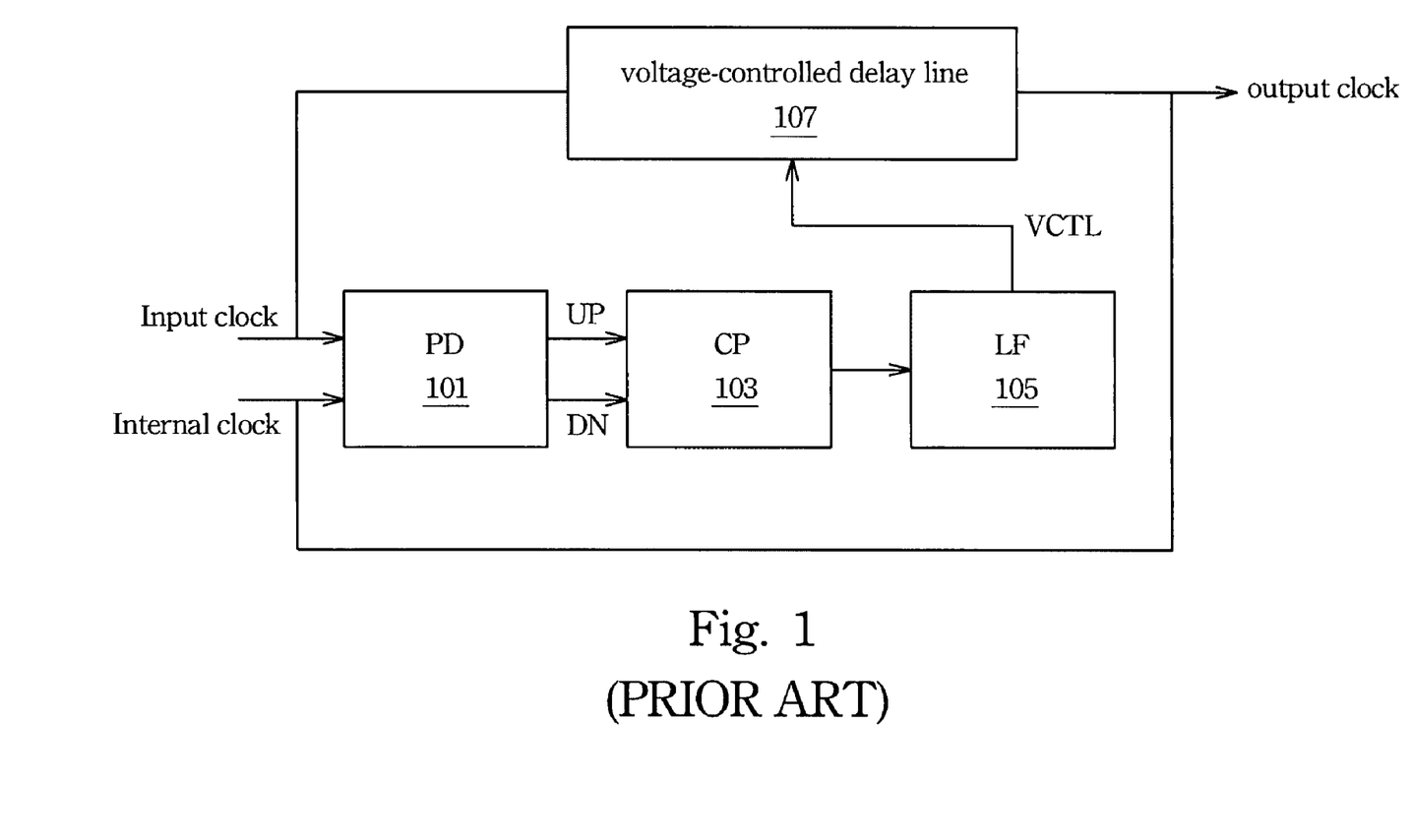
FIG. 1 shows the block diagram of the conventional DLL.

FIG. 1 shows a block diagram of the conventional DLL. The DLL includes a voltage-controlled delay line 107 (VCDL), a phase detector 101 (PD), a loop filter 105 (LF), and a charge pump 103 (CP). The PD 101 detects the phase difference between the internal clock and the input clock. The LF 105 is usually implemented with a single capacitor, which is charged/discharged by the CP 103, to reduce the high-frequency noises and provide a constant dc level to the VCDL 107.

The output signals of PD 101 (UP and DN) are integrated to the CP 103 and LF 105 to generate a control voltage (VCTL) for the delay line 107. When the circuit is locked, VCTL is a constant and the VCDL 107 finds the optimum path so that the input clock and the internal clock can be synchronized.

However, in this conventional DLL, the control voltage VCTL cannot keep up with the UP/DN signal when the UP/DN signal changes rapidly, which makes the DLL unstable. As a result, the entire circuit on the chip is unstable as well.

Therefore, there is a need for a new delay-locked loop and a stabilization method thereof which can be stable under the high speed operation condition.

SUMMARY

According to one embodiment of the present invention, a delay-locked loop includes a phase detector, a shift register, a digital low pass filter, a digital-to-analog converter, a bias circuit, and a delay circuit.

The phase detector generates a lagging signal and a leading signal corresponding to a phase difference between an input clock signal and a feedback clock signal. The shift register outputs a digital data according to the lagging signal and the leading signal, in which only one bit of the digital data is logic one. The digital low pass filter generates a selecting signal according to the digital data, in which the bit number of the digital data is a multiple of the bit number of the selecting signal. The digital-to-analog converter converts the selecting signal into a bias voltage. The bias circuit generates a first control voltage and a second control voltage in response to the bias voltage. The delay circuit generates the feedback clock signal corresponding to the first control voltage and the second control voltage.

According to another embodiment of the present invention, the method for stabilizing a delay locked loop first generates a leading/lagging signal by detecting a phase difference between an input clock signal and a feedback clock signal. Next, the method transforms the leading/lagging signal into a digital data, in which only one bit of the digital data is logic one. Then the method groups the digital data into a plurality of data groups, in which each data group outputs one bit of a selecting signal, and the bit number of the selecting signal is less than the bit number of the digital data. After that, the method generates a bias voltage to tune a delay time according to the selecting signal.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
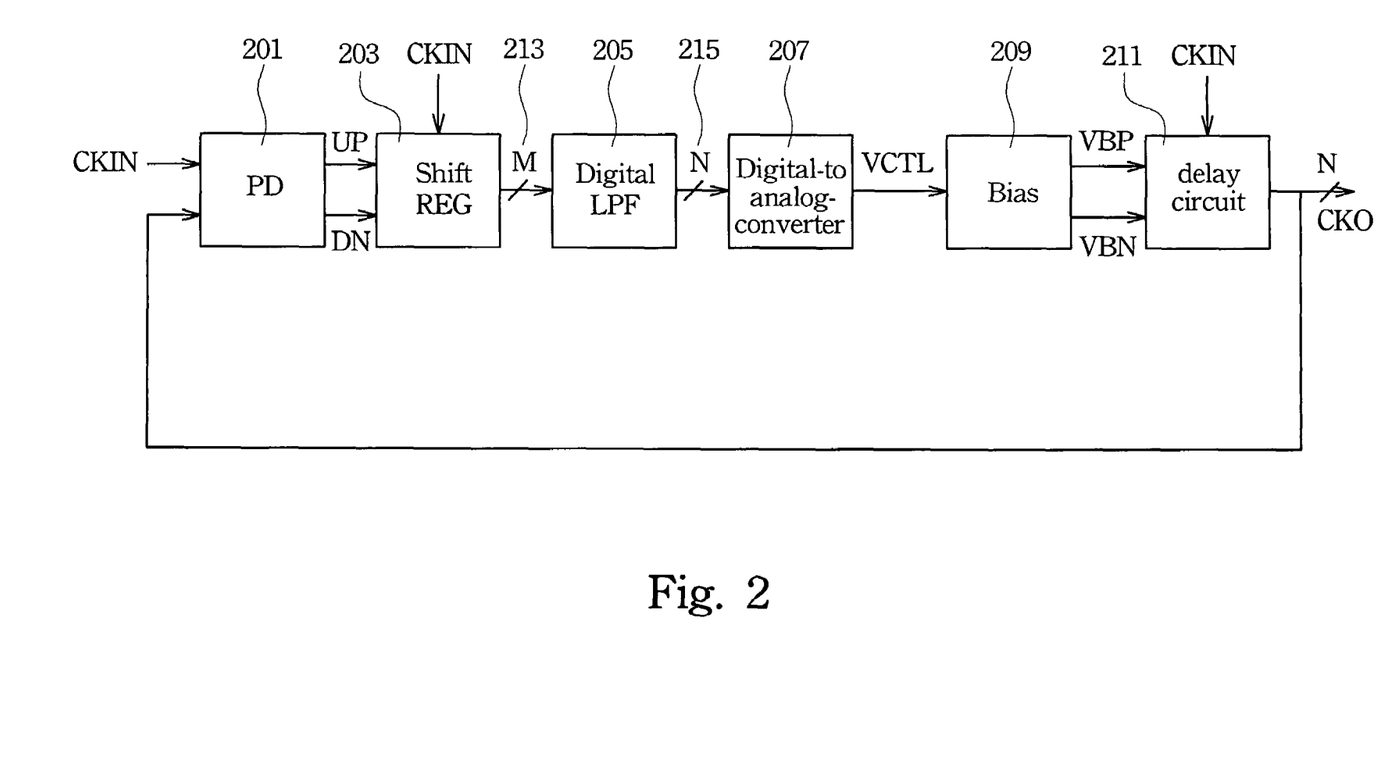
FIG. 2 shows a block diagram of the DLL according to one embodiment of the present invention.

FIG. 2 shows a block diagram of the DLL according to one embodiment of the present invention. The DLL includes a phase detector 201, a shift register 203, a digital low pass filter 205, a digital-to-analog converter 207, a bias circuit 209, and a delay circuit 211.

The phase detector 201 generates a lagging signal (UP) and a leading signal (DN) corresponding to a phase difference between the input clock signal CKIN and an N bits feedback clock signal CKO. The shift register 203 outputs a digital data 213 according to the lagging signal and the leading signal, in which only one bit of the digital data 213 is logic one. The digital low pass filter 205 generates a selecting signal 215 according to the digital data 213, in which the bit number (M bits) of the digital data 213 is a multiple of the bit number of the selecting signal (N bits) 215.

The digital-to-analog converter 207 converts the selecting signal 215 into a bias voltage VCTL. The bias circuit 209 generates a first control voltage VBP and a second control voltage VBN in response to the bias voltage VCTL. The delay circuit 211 generates the feedback clock signal CKO corresponding to the first control voltage VBP and the second control voltage VBN.

Figure 3:
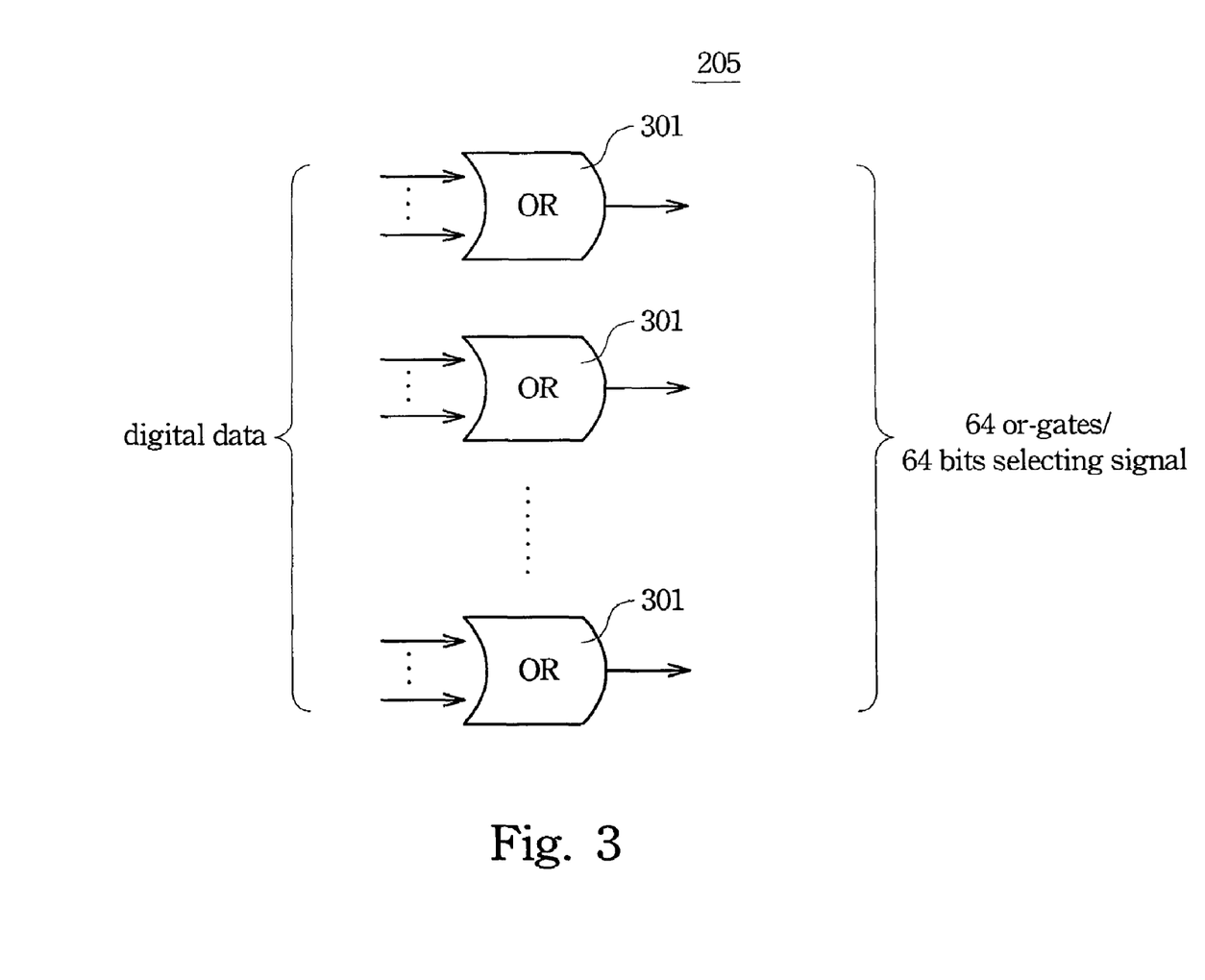
FIG. 3 shows the digital low pass filter according to one embodiment of the present invention.

FIG. 3 shows the digital low pass filter according to one embodiment of the present invention. The digital low pass filter 205 includes several or-gates 301, each of the or-gates 301 receives at least two bits of the digital data 213 and outputs one bit of the selecting signal 215. In the digital low pass filter 205 shown in FIG. 3, the bit number of the digital data 213 is four times the bit number of the selecting signal 215.

For example, if the shift register 203 has 256 flip-flops and outputs the digital data of 256 bits, and the digital low pass filter 205 needs to output the selecting signal 215 of 64 bits, then 64 or-gates 301 are used in the low pass filter 205, each of the or-gates 301 receives 4 bits of the digital data 213 and outputs one bit of selecting signal 215 as a result.

Each or-gate 301 outputs logic 1 if any one of its inputs is logic 1, and outputs logic 0 only if all of its inputs are logic 0. Because only one bit of the digital data is logic 1 (which means only one input of all the or-gates 301 is logic 1), only one of the or-gates 301 outputs logic 1 as a result. Hence, the 64 bits selecting signal 215, which is the outputs of the or-gates 301, changes only once when the 256 bits digital data 213 has shifted four times. In other words, the changing frequency of the selecting signal 215 and the digital data 213 is 1 over 4. Accordingly, the changing frequency of the bias voltage VCTL and the control voltage VBP/VBN, generated in response to the selecting signal 215, is reduced to ¼ of the digital data 213 changing frequency. Hence, the bias voltage VCTL and the control voltage VBP/VBN have enough time to change their states, and the DLL can be stable.

Figure 4:
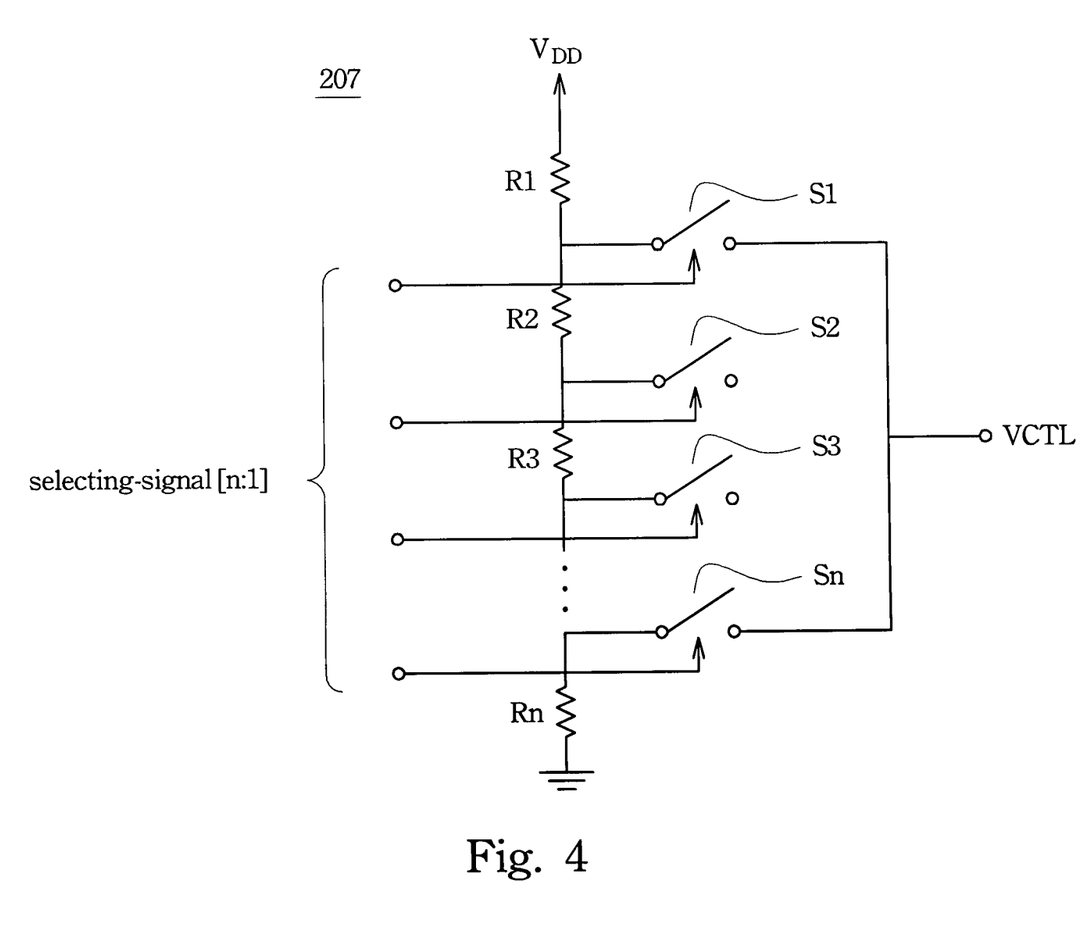
FIG. 4 shows the circuit of the digital-to-analog converter according to one embodiment of the present invention.

FIG. 4 shows the circuit of the digital-to-analog converter according to one embodiment of the present invention. The digital-to-analog converter 207 includes the resistors R1, R2, R3 ... Rn electrically connected serially. The switches S1, S2, S3 ... and Sn are controlled by the selecting signal 215 for selecting the resistors R1, R2, R3 ... Rn to divide the supply voltage $V_{DD}$ to generate the bias voltage VCTL. For example, if only switch S1 is turned on, then the bias voltage VCTL equals to $(R1/R1+R2+ \ldots Rn) \cdot V_{DD}$.

Figure 5:
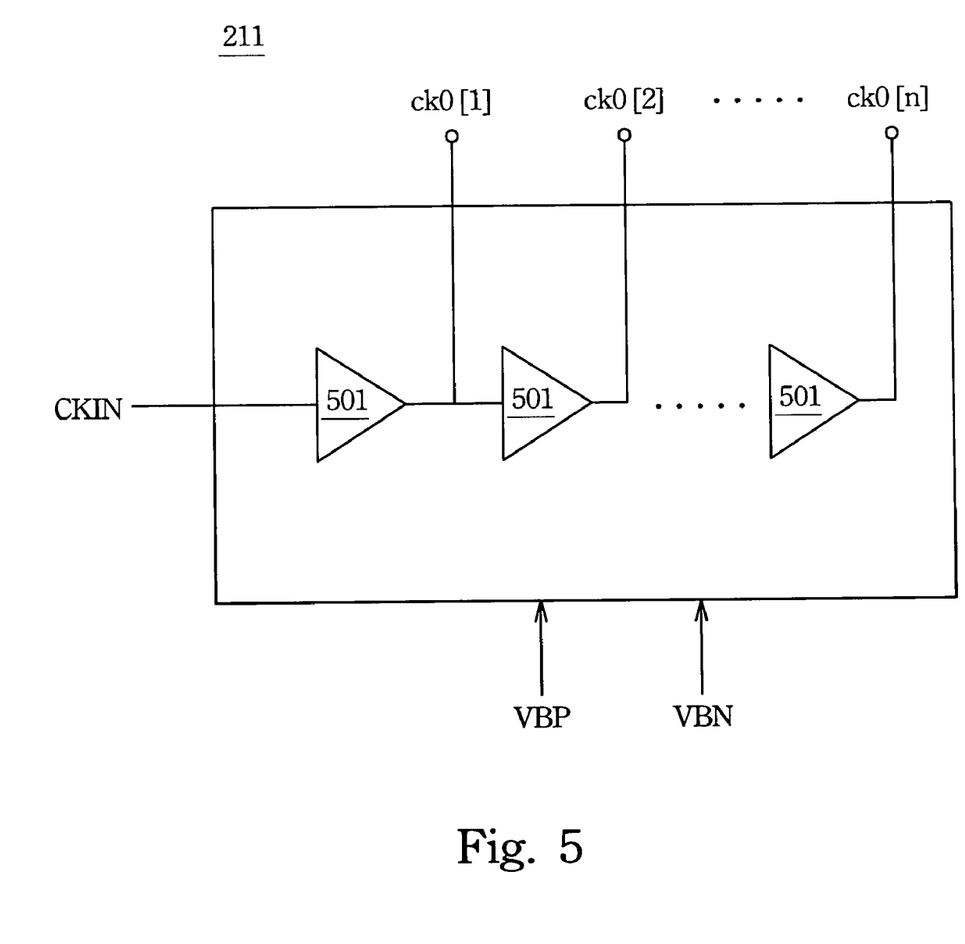
FIG. 5 shows the circuit of the voltage-controlled delay line according to one embodiment of the present invention.

FIG. 5 shows the delay circuit according to one embodiment of the present invention. The delay circuit 211 includes several buffers 501 electrically connected serially. Each buffer 501 outputs one bit of the feedback clock signal CKO. Each bit of the feedback clock signal CKO has a phase difference compared with other bits. The delay time of each buffer 501 is tuned according to the first control voltage VBP and the second control voltage control VBN. Because the buffers 501 are electrically connected serially, the nth feedback clock signal (CKO[n]) has the most phase difference compare with the input clock signal CKIN.

The first control voltage VBP and the second control voltage control VBN are tuned by the Bias circuit 209 according to the value of the bias voltage VCTL, and the delay of the buffer 501 are changed accordingly. For example, if the feedback clock signal CKO lags the input clock signal CKIN, the UP signal and the DN signal are logic 1 and logic 0 respectively. Hence, the bias voltage VCTL raises, the second control voltage VBN and the delay time of buffer 501 raise as well (the first control voltage VBP decreases in this case), which makes the feedback clock signal CKO keep up with the input clock signal CKIN.

On the contrary, if the feedback clock signal CKO leads the input clock signal CKIN, the UP signal and the DN signal are logic 0 and logic 1 respectively. Hence, the bias voltage VCTL decreases, the second control voltage control VBN and the delay time of buffer 501 decreases as well (the first control voltage VBP increases in this case), which makes the feedback clock signal CKO keep down with the input clock signal CKIN.

Figure 6:
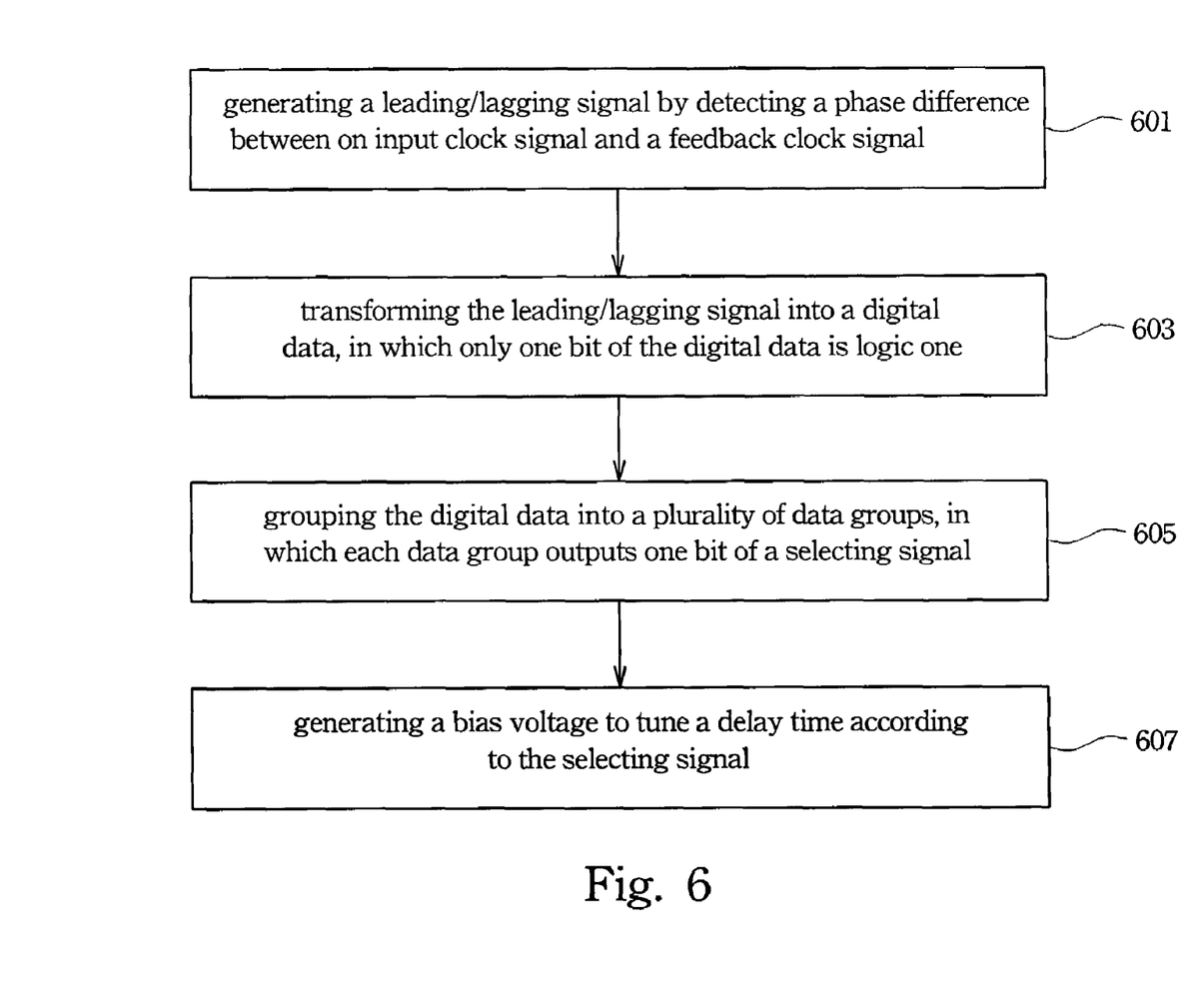
FIG. 6 shows the flow chart of the method for stabilizing a delay-locked loop according to another embodiment of the present invention.

FIG. 6 shows the flow chart of the method for stabilizing a delay locked loop according to another embodiment of the present invention. The method first generates a leading/lagging signal by detecting a phase difference between an input clock signal and a feedback clock signal (step 601), then transforms the leading/lagging signal into a digital data, in which only one bit of the digital data is logic one (step 603). In step 603, the transformation is done with a shift register. The shift register 203 may include several flip-flops, such as 256 flip-flops, and the leading/lagging signal controls which flip-flops should output logic 1.

After the digital data has been generated, the method groups the digital data into a plurality of data groups (step 605), in which each data group outputs one bit of a selecting signal, and the bit number of the selecting signal is less than the bit number of the digital data. The grouping step can be implemented with several or-gates, each receives at least two bits of the digital data, and outputs one bit of the selecting signal. By grouping with the or-gates, the changing frequency of the selecting signal is much less than the changing frequency of the digital data. Next, the method generates a bias voltage according to the selecting signal to tune a delay time of the buffer (step 607). The buffer receives the input clock signal and generates the feedback clock signal in respond to the delay time. For example, the delay time is decreased when the feedback clock signal lags the input clock signal, and is increased while the feedback clock signal leads the input clock signal.

According to the above embodiments, with the grouping step, the changing frequency of the selecting signal is reduced, and the bias voltage/control voltage has enough time to response to the changes of the selecting signal. Therefore, the DLL can be stable.

It will be apparent to those skilled in the art that various modifications and variations can be made to the structure of the present invention without departing from the scope or spirit of the invention. In view of the foregoing, it is intended that the present invention cover modifications and variations of this is invention provided they fall within the scope of the following claims and their equivalents.

What is claimed is:

1. A delay-locked loop, comprising:
a phase detector generating a lagging signal and a leading signal corresponding to a phase difference between an input clock signal and a feedback clock signal;
a shift register shifting a digital data and outputting the digital data according to the lagging signal and the leading signal, only one bit of the digital data being a logic one;
a digital low pass filter coupled to the shift register, the digital low pass filter generating a selecting signal according to the digital data, only one bit of the selecting signal being a logic one, and a bit number of the digital data being a multiple of a bit number of the selecting signal;
a digital-to-analog converter converting the selecting signal into a bias voltage;
a bias circuit generating a first control voltage and a second control voltage in response to the bias voltage; and
a delay circuit generating the feedback clock signal corresponding to the first control voltage and the second control voltage.

2. The delay-locked loop as claimed in claim 1, wherein the digital low pass filter consists essentially of a plurality of or-gates, each receiving at least two bits of the digital data and outputting one bit of the selecting signal.

3. The delay-locked loop as claimed in claim 1, wherein the bit number of the digital data is four times of the bit number of the selecting signal.

4. The delay-locked loop as claimed in claim 1, wherein the shift register comprises 256 flip-flops, and the digital data is 256 bits.

5. The delay-locked loop as claimed in claim 4, wherein the selecting signal is 64 bits.

6. The delay-locked loop as claimed in claim 1, wherein the digital-to-analog converter comprises a plurality of resistors electrically connected serially, and the selecting signal selects the resistors for dividing a supply voltage to generate the bias voltage.

7. The delay-locked loop as claimed in claim 1, wherein the delay circuit comprises a plurality of buffers electrically connected serially, and each buffer outputs one bit of the feedback clock signal.

8. The delay-locked loop as claimed in claim 7, wherein the first control voltage and the second control voltage control a delay time of each buffer.

9. The delay-locked loop as claimed in claim 8, wherein the delay time is decreased while the feedback clock signal lags the input clock signal.

10. The delay-locked loop as claimed in claim 8, wherein the delay time is increased while the feedback clock signal leads the input clock signal.

11. A method for stabilizing a delay locked loop, comprising:

generating a leading signal and a lagging signal by detecting a phase difference between an input clock signal and a feedback clock signal;

transforming the leading and lagging signals into a digital data and shifting the digital data, only one bit of the digital data being a logic one;

grouping the digital data into a plurality of data groups, wherein each data group outputs one bit of a selecting signal, such that a bit number of the digital data is a multiple of a bit number of the selecting signal, and only one bit of the selecting signal is a logic one; and generating a bias voltage to tune a delay time according to the selecting signal.

12. The method as claimed in claim 11, wherein the digital data is grouped by a plurality of or-gates, each or-gate receiving at least two bits of the digital data and outputting one bit of the selecting signal.

13. The method as claimed in claim 11, wherein the digital data is generated by a shift register which receives the leading and the lagging signal.

14. The method as claimed in claim 11, wherein the selecting signal selects at least one resistor for dividing a supply voltage to generate the bias voltage.

15. The method as claimed in claim 11, wherein the buffer receives the input clock signal and generates the feedback clock signal according to the delay time.

16. The method as claimed in claim 15, wherein the delay time is decreased while the feedback clock signal lags the input clock signal, and is increased while the feedback clock signal leads the input clock signal.

* * * * *